United States Patent
Kurashina et al.

(10) Patent No.: US 9,556,533 B2
(45) Date of Patent: Jan. 31, 2017

(54) SUBSTRATE PROCESSING APPARATUS AND SUBSTRATE PROCESSING METHOD

(75) Inventors: Keiichi Kurashina, Tokyo (JP); Tsutomu Nakada, Tokyo (JP)

(73) Assignee: EBARA CORPORATION, Tokyo (JP)

(*) Notice: Subject to any disclaimer, the term of this patent is extended or adjusted under 35 U.S.C. 154(b) by 914 days.

(21) Appl. No.: 13/572,924

(22) Filed: Aug. 13, 2012

(65) Prior Publication Data

US 2013/0056361 A1    Mar. 7, 2013

(30) Foreign Application Priority Data

Aug. 19, 2011  (JP) .................. 2011-179544

(51) Int. Cl.
  C25D 5/08    (2006.01)
  C25D 7/12    (2006.01)
  C25D 17/02   (2006.01)
  H01L 21/288  (2006.01)
  H01L 21/768  (2006.01)

(52) U.S. Cl.
  CPC .............. *C25D 17/02* (2013.01); *C25D 5/08* (2013.01); *C25D 7/123* (2013.01); *H01L 21/2885* (2013.01); *H01L 21/76877* (2013.01); *H01L 21/76879* (2013.01)

(58) Field of Classification Search
  CPC ......... C25D 5/08; C25D 7/123; C25D 17/001; C25D 21/10; H01L 21/76877; H01L 21/76879; H01L 21/2885
  See application file for complete search history.

(56) References Cited

FOREIGN PATENT DOCUMENTS

| JP | 5-98455      | 4/1993  |
| JP | 6-146068     | 5/1994  |
| JP | 11-256345    | 9/1999  |
| JP | 11-335895    | 12/1999 |
| JP | 2000-87290   | 3/2000  |
| JP | 2000-256896  | 9/2000  |
| JP | 2003-73893   | 3/2003  |
| JP | 3778239      | 5/2006  |
| JP | 2008-121062  | 5/2008  |
| JP | 2009-263758  | 11/2009 |
| JP | 2009263758 A | * 11/2009 |
| TW | 497168       | 8/2002  |

OTHER PUBLICATIONS

Machine Translation of JP 5-98455 A to Minuro et al. (1993).*
Abstract and Machine Translation of JP2009-263758A.*

* cited by examiner

*Primary Examiner* — Bryan D. Ripa
(74) *Attorney, Agent, or Firm* — Wenderoth, Lind & Ponack, L.L.P.

(57) ABSTRACT

A substrate processing apparatus includes a plurality of inlet pipes and a plurality of outlet pipes, connected to a processing tank and configured to be switched therebetween to create a flow of a processing liquid in the processing tank in a direction different from that of the processing liquid before the switching. The inlet pipes and the outlet pipes are each provided with a flow control device which is controlled by a control section so that upon the switching, a flow rate of the processing liquid flowing therethrough changes with time.

2 Claims, 12 Drawing Sheets

FIG. 1A  FIG. 1B  FIG. 1C
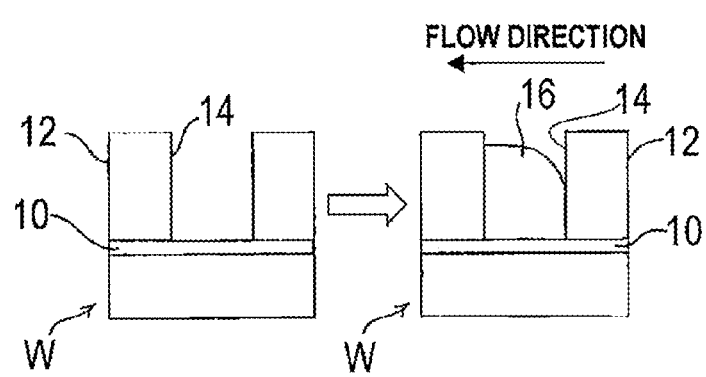
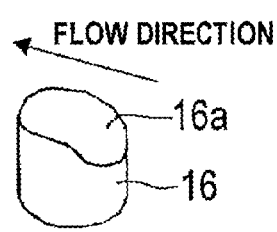
FIG. 2A  FIG. 2B
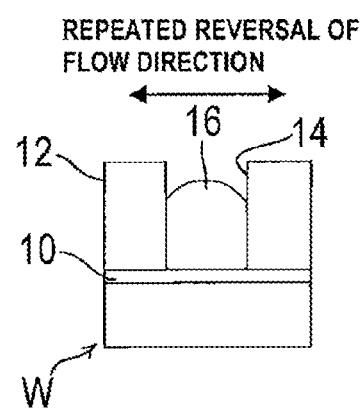
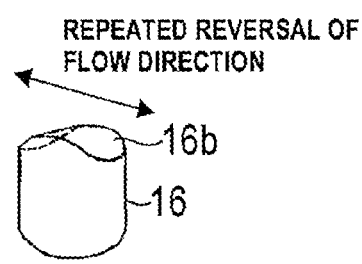

SUBSTRATE PROCESSING APPARATUS AND SUBSTRATE PROCESSING METHOD

CROSS-REFERENCE TO RELATED APPLICATIONS

This application claims priority to Japanese Application Number 2011-179544, filed Aug. 19, 2011, the contents of which are hereby incorporated by reference.

BACKGROUND OF THE INVENTION

Field of the Invention

The present invention relates to a substrate processing apparatus and a substrate processing method which are useful for performing processing using a liquid (processing liquid), such as plating, pre-plating treatment, electrolytic etching, etc. on a surface of a substrate such as a semiconductor wafer.

Description of the Related Art

Metal plating, such as copper plating, has recently been employed as a method to fill a metal (interconnect material) into fine interconnect trenches or vias provided in a surface of a substrate, such as a semiconductor wafer. Metal plating has come to be commonly used also as a method to form protruding connection electrodes (bumps) of gold, copper, solder or nickel, or of a multi-layer laminate of such metals at predetermined positions (electrodes) on a surface of a semiconductor chip on which interconnects are formed.

When filling a metal (plated film) into fine interconnect trenches or vias, provided in a surface of a substrate, by metal plating, the intensity of a flow of a plating solution, flowing along the surface of the substrate, is of importance. Adsorption of an additive, contained in the plating solution, onto the substrate surface (surface to be plated) is affected by the intensity of a flow of the plating solution flowing along the surface of the substrate. The intensity of the flow of the plating solution therefore affects the effect of the additive, e.g., inhibition or promotion of the growth of a plated film. Further, a non-uniform flow of the plating solution along the surface adversely affects the uniformity of the performance of plating. A technique for allowing a plating solution to flow uniformly parallel to a substrate has been developed to obtain a uniform distribution of the flow of the plating solution along the surface of the substrate (see patent documents 1 and 2).

Because of the consumption of an additive or a metal ion in a plating solution, a difference in the plating performance can be produced between the upstream side and the downstream side of a flow of the plating solution along a substrate surface even when the flow is uniform over the substrate surface. In view of this, a method has been proposed which involves reversing the direction of a flow of a plating solution repeatedly during plating (patent documents 3 to 5).

Thus, it is progressing to improve the equalization of a flow of a plating solution along a substrate surface. It is also important to equalize (flatten) the surface profile of a metal (plated film) embedded in fine interconnect trenches or vias, or bumps formed at predetermined positions on a surface of a semiconductor chip. For example, in the formation of a bump by electroplating as performed by preparing a substrate W, having an opening 14 formed in a resist 12 on a surface of a seed layer 10, as shown in FIG. 1A, and bringing the surface of the substrate W into contact with a plating solution flowing only in one direction, as shown in FIG. 1B, to form a bump (plated film) 16 in the opening 14, the bump (plated film) 16 tends to grow faster on the downstream side of the flow of the plating solution than on the upstream side (this tendency is strongly affected by the properties of the plating solution used and, in certain cases depending on a type of the plating solution, the bump 16 grows rather slower on the downstream side). As shown in FIG. 1C, the surface 16a of the bump (plated film) 16 formed is highly inclined on its one side toward one direction along the flow direction of the plating solution.

When the substrate W shown in FIG. 1A is prepared and the surface of the substrate W is brought into contact with a plating solution, whose flow direction is reversed repeatedly, as shown in FIG. 2A, to form a bump (plated film) 16 in the opening 14, the surface 16b of the bump (plated film) 16 formed, though improved to some extent, has an arched profile, as shown in FIG. 2B. In order to avoid such drawbacks and flatten a surface of a plated film, it is necessary to perform plating of a substrate surface by bringing the substrate surface into contact with a plating solution whose flow direction can be switched among three or more directions.

When plating of a substrate surface is carried out by bringing the substrate surface into contact with a plating solution whose flow direction can be reversed, or switched among three or more directions, and when the reversal (switching) of the flow direction of the plating solution in a plating tank is performed by on-off control of an on-off valve, for example, a slight mistiming in opening/closing of the on-off valve could stop the flow of the plating solution, or conversely, instantaneously increase the flow rate (flow velocity) of the plating solution flowing into the plating tank. This may result in lowering of the plating performance when the plating performance depends on the intensity of the flow of the plating solution. The above phenomenon is virtually unavoidable if on/off control of an on-off valve is employed to reverse (switch) the flow direction of a plating solution in a plating tank.

For example, consider the case where a first plating solution supply system A and a second plating solution supply system B, each having an on-off valve to be on/off-controlled, are used, and plating solutions are supplied in orthogonal directions into a plating tank P alternately from the respective supply systems during plating, as shown in FIG. 3. The on-off valve of the first plating solution supply system A is turned on and the on-off valve of the second plating solution supply system B is turned off when supplying a plating solution into the plating tank P through the first plating solution supply system A. The on-off valve of the second plating solution supply system B is turned on and the on-off valve of the first plating solution supply system A is turned off when supplying a plating solution into the plating tank P through the second plating solution supply system B.

Upon switching from the first plating solution supply system A to the second plating solution supply system B, the operation of closing the on-off valve of the first plating solution supply system A must be performed simultaneously with the operation of opening the on-off valve of the second plating solution supply system B. If the on-off valve of the first plating solution supply system A is closed later, or the on-off valve of the second plating solution supply system B is opened earlier, then the flow rate (flow velocity) of the plating solution, flowing into the plating tank P, increases instantaneously, as shown in FIG. 4A. Conversely, if the on-off valve of the first plating solution supply system A is closed earlier, or the on-off valve of the second plating solution supply system B is opened later, then the flow rate (flow velocity) of the plating solution, flowing into the plating tank P, decreases instantaneously or becomes zero, as shown in FIG. 4B.

The applicant has proposed a plating apparatus and method which uses a plurality of inlet pipes and a plurality of outlet pipes, connected to a plating tank, and can arbitrarily switch the flow direction of a processing liquid in the plating tank by performing switching between the inlet pipes and between the outlet pipes (see patent documents 6 and 7).

PRIOR ART DOCUMENTS

Patent document 1: Japanese Patent No. 3778239
Patent document 2: Japanese Patent Laid-Open Publication No. 2000-256896
Patent document 3: Japanese Patent Laid-Open Publication No. H11-335895
Patent document 4: Japanese Patent Laid-Open Publication No. 2003-073893
Patent document 5: Japanese Patent Laid-Open Publication No. H5-098455
Patent document 6: Japanese Patent Laid-Open Publication No. 2008-121062
Patent document 7: Japanese Patent Laid-Open Publication No. 2009-263758

SUMMARY OF THE INVENTION

The present invention has been made in view of the above situation. It is therefore an object of the present invention to provide a substrate processing apparatus and a substrate processing method which allow a processing liquid, such as a plating solution, to flow along a surface of a substrate uniformly and parallel to the substrate and can arbitrarily switch the flow direction of the processing liquid without causing a change in the overall flow rate of the processing liquid nor creating a non-uniform flow of the processing liquid.

The following findings have been obtained in the present inventors' studies: The direction of a flow of a plating solution along a surface of a substrate in a plating tank can be switched without causing an instantaneous increase or decrease in the flow rate (flow velocity) of the plating solution by performing the switching of the flow direction of the plating solution not instantaneously by on/off control of an on-off valve but slowly by a valve (flow control valve) having a flow rate control function, in particular by gradually closing a valve provided in a plating solution supply system for creating one flow of the plating solution in the plating tank and gradually opening a valve provided in a plating solution supply system for creating another flow of the plating solution in the plating tank while keeping the overall flow rate of the plating solution constant. In practice, a flow control valve is used in combination with a flow meter; an output signal from the flow meter is fed back to the flow control valve so as to control the flow rate of the plating solution. The valve opening/closing operation is performed gradually while controlling the flow rate of the plating solution flowing in each valve so that the overall flow rate of the plating solution is kept constant. Instead of using the combination of a flow control valve and a flow meter, it is possible to use a mass flow controller in which a flow control valve and a flow meter are integrated.

The present invention has been made based on the above findings, and provides a substrate processing apparatus comprising: a processing tank for holding a processing liquid; a substrate holder for holding a substrate and bringing the substrate into contact with the processing liquid in the processing tank; a plurality of inlet pipes and a plurality of outlet pipes, connected to the processing tank and to be switched therebetween to create a flow of the processing liquid which flows along a surface of the substrate in the processing tank in a direction different from that of the processing liquid before the switching; and a pump for supplying the processing liquid into the processing tank in a circulatory manner through the inlet pipes and the outlet pipes, wherein the inlet pipes and the outlet pipes are each provided with a flow control device which is controlled by a control section so that upon switching between the pipes, the flow rate of the processing liquid flowing along the surface of the substrate changes with time.

Thus, when switching the flow direction of the processing liquid flowing along the surface of the substrate in the processing tank, the flow rate of the processing liquid, flowing in each of the inlet pipes and the outlet pipes, is controlled by the flow control devices so that the flow rate changes with time. This makes it possible to switch the flow direction of the processing liquid flowing along the surface of the substrate in the processing tank without instantaneously increasing or decreasing the flow rate (flow velocity) of the processing liquid.

Preferably, the flow control device is controlled so that the processing liquid is supplied into the processing tank at a constant flow rate even upon switching between the inlet pipes and between the outlet pipes.

This makes it possible to switch the flow direction of the processing liquid flowing along the surface of the substrate in the processing tank while continuously supplying the processing liquid at a constant flow rate into the processing tank.

The present invention also provides a substrate processing method comprising: selectively using one of a plurality of inlet pipes and one of a plurality of outlet pipes, the inlet pipes and outlet pipes being connected to a processing tank, to supply a processing liquid into the processing tank in a circulatory manner and create a flow of the processing liquid which flows in one direction along a surface of a substrate in the processing tank; and switching the inlet pipe and the outlet pipe to another one of the plurality of inlet pipes and another one of the plurality of outlet pipes to supply the processing liquid into the processing tank in a circulatory manner and create a flow of the processing liquid which flows in another direction along the surface of the substrate in the processing tank, wherein upon the switching between the inlet pipes and between the outlet pipes, the flow rate of the processing liquid, flowing in each of the inlet pipes and the outlet pipes, is changed with time.

Preferably, the flow rate of the processing liquid, flowing in each of the inlet pipes and the outlet pipes, is changed with time so that the processing liquid is supplied into the processing tank at a constant flow rate even upon switching between the inlet pipes and between the outlet pipes.

The substrate processing apparatus and the substrate processing method of the present invention make it possible to perform switching of the flow direction of a processing liquid, flowing along a surface of a substrate in a processing tank, without a temporary increase or decrease in the flow rate (flow velocity), thus enabling uniform plating of the substrate keeping in contact with the processing liquid in the processing tank.

BRIEF DESCRIPTION OF THE DRAWINGS

FIGS. 1A through 1C are diagrams schematically illustrating plating as performed by bringing a substrate into contact with a plating solution flowing only in one direction;

FIGS. 2A and 2B are diagrams schematically illustrating plating as performed by bringing a substrate into contact with a plating solution whose flow direction is reversed repeatedly;

DETAILED DESCRIPTION OF THE PREFERRED EMBODIMENTS

Figure 3:
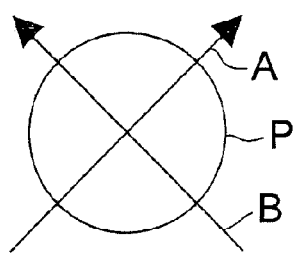
FIG. 3 is a diagram schematically showing a plating apparatus which performs plating by supplying plating solutions into a plating tank alternately from a first plating solution supply system and a second plating solution supply system, each having an on-off valve to be on/off-controlled.
Figure 4A:
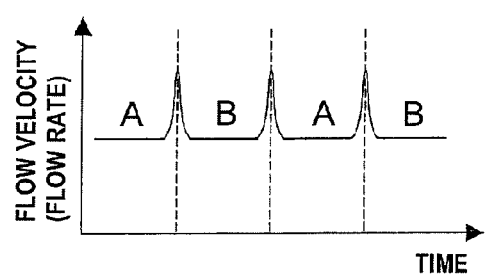
FIGS. 4A and 4B are diagrams each showing a change in the flow velocity of a plating solution in the plating tank of the plating apparatus shown in FIG. 3.
Figure 4B:
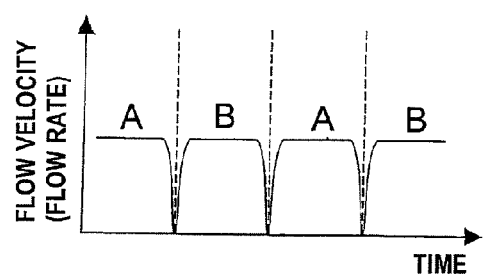

Preferred embodiments of the present invention will now be described in detail with reference to FIGS. 5 through 15. The same reference numerals will be used throughout the drawings and the description to refer to the same or like members, components, etc., and a duplicate description thereof will be omitted. Though the following description illustrates the present invention as applied to an electroplating apparatus, the present invention can be applied to various other types of substrate processing apparatuses using a liquid (processing liquid), such as an electroless plating apparatus, a pre-plating treatment apparatus, an electrolytic etching apparatus, etc.

Figure 5:
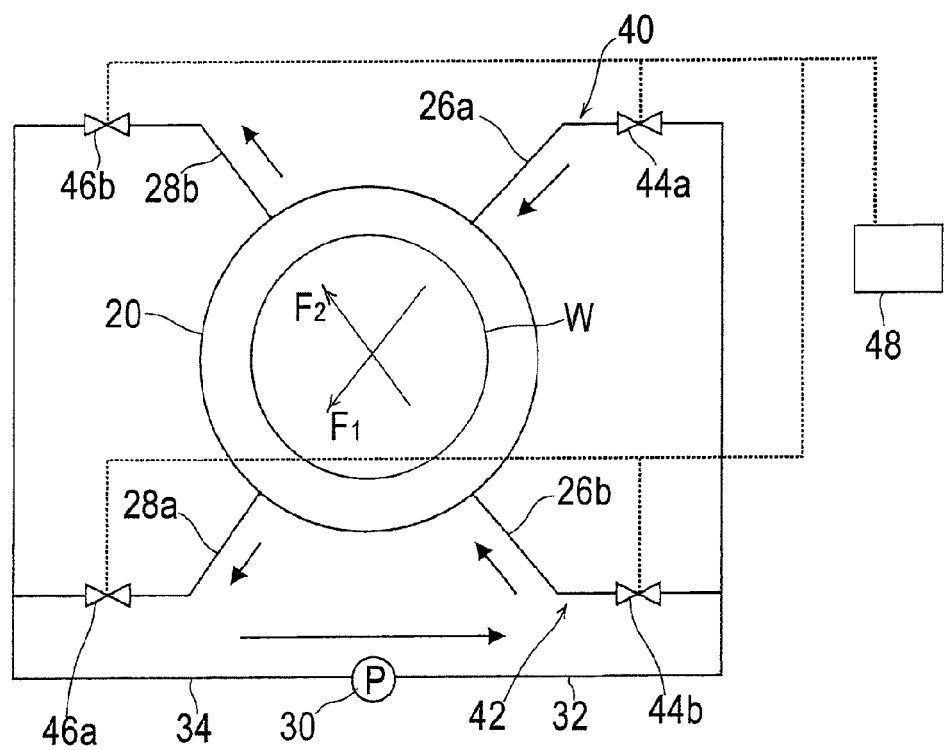
FIG. 5 is a schematic plan view showing the construction of a substrate processing apparatus according to an embodiment of the present invention, which is applied to an electroplating apparatus.
Figure 6:
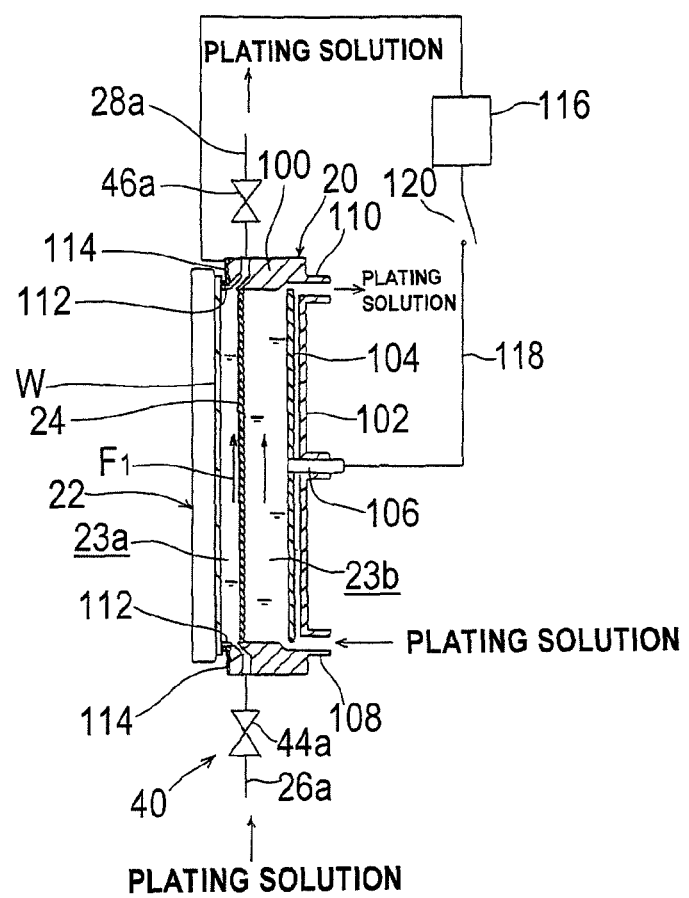
FIG. 6 is a cross-sectional diagram schematically showing a plating tank and a first plating solution supply system of the electroplating apparatus (substrate processing apparatus) shown in FIG. 5.

FIG. 5 is a schematic plan view showing the construction of a substrate processing apparatus according to an embodiment of the present invention, which is applied to an electroplating apparatus for performing electroplating of a surface of a substrate, such as a semiconductor wafer; and FIG. 6 is a schematic sectional side view showing a plating tank and a first plating solution supply system of the electroplating apparatus (substrate processing apparatus) shown in FIG. 5.

As shown in FIGS. 5 and 6, the electroplating apparatus includes a plating tank (processing tank) 20 for holding a plating solution (processing liquid) therein, and a substrate holder 22 which is movable toward the plating solution tank 20 and which attracts and holds a substrate W in a vertical position. In the plating tank 20 is provided a flat plate-like diaphragm 24 which separates the interior of the plating tank 20 into a substrate-side flow passage space 23a and an anode-side space 23b in which an anode is housed. The substrate holder 22 is comprised of a generally-flat plate and has, in its one surface, not-shown suction holes so that a substrate W, placed on the surface, can be attracted to and held on the surface by suction through the suction holes. The substrate W held by the substrate holder 22 is brought into contact with the open end of the plating tank 20 so as to close the opening of the plating tank 20, thereby forming the closed flow passage space 23a between the substrate W and the diaphragm 24.

To the peripheral wall 100 of the plating tank 20 are connected two inlet pipes 26a, 26b for supplying a plating solution into the flow passage space 23a of the plating tank 20, and two outlet pipes 28a, 28b for discharging the plating solution from the flow passage space 23a of the plating tank 20. The inlet pipes 26a, 26b are connected to a discharge pipe 32 extending from the discharge port of a pump 30, while the outlet pipes 28a, 28b are connected to a suction pipe 34 extending from the suction port of the pump 30.

The inlet pipe 26a and the outlet pipe 28a are disposed at opposite positions in the diametrical direction of the plating tank 20, and constitute a first plating solution supply system 40 which creates a flow of the plating solution, flowing in the direction of arrow $F_1$, in the flow passage space 23a of the plating tank 20. On the other hand, the inlet pipe 26b and the outlet pipe 28b are disposed at opposite positions in the diametrical direction of the plating tank 20, and constitute a second plating solution supply system 42 which creates a flow of the plating solution, flowing in the direction of arrow $F_2$ perpendicular to the direction of arrow $F_1$, in the flow passage space 23a of the plating tank 20. One of the first plating solution supply system 40 and the second plating solution supply system 42 is used selectively.

The flow rate of the plating solution, flowing in each of the inlet pipes 26a, 26b, is controlled not by on-off control but in such a manner that the flow rate changes with time. To perform such a flow control, in this embodiment, the inlet pipes 26a, 26b are provided with flow control devices 44a, 44b, respectively, which are each comprised of a mass flow controller in which a flow meter and a flow control valve are integrated. The flow rate of the plating solution, flowing in each of the outlet pipes 28a, 28b, is also controlled not by on-off control but in such a manner that the flow rate changes with time. To perform such a flow control, in this embodiment, the outlet pipes 28a, 28b are provided with flow control devices 46a, 46b, respectively, which are each comprised of a mass flow controller in which a flow meter and a flow control valve are integrated. Each of the flow control devices (mass flow controllers) 44a, 44b, 46a, 46b is controlled by a signal from a control section 48.

The plating tank 20 includes the cylindrical peripheral wall 100 having approximately the same outside dimension as the substrate holder 22, and a bottom plate 102 which forms the anode-side space 23b between the bottom plate 102 and the diaphragm 24. An anode 104 is housed in the anode-side space 23b. The anode 104, at the center, is secured to the bottom plate 102 via a support shaft 106. An electric current is fed to the anode 104 through the support shaft 106.

The anode 104 may be a soluble anode made of the same element (copper) as the plating metal. A soluble anode, because of its consumption during its use in plating, necessitates periodic replacement. In the electroplating apparatus of this embodiment, the plating solution is separated by the diaphragm 24 into the substrate W-side solution and the anode 104-side solution. Therefore, there is no fear of bubbles, generated at the anode 104, adhering to a substrate W. An insoluble anode, which requires little maintenance, is therefore used as the anode 104.

A plating solution supply pipe 108 for supplying the plating solution into the anode-side space 23b of the plating tank 20 and a plating solution discharge pipe 110 for discharging the plating solution from the anode-side space 23b are mounted to the plating tank 20 at two (upper and lower) opposite positions across the bottom plate 102. By the actuation of a pump, the plating solution is supplied from a not-shown plating solution supply tank into the anode-side space 23b through the plating solution supply pipe 108, while the plating solution discharged from the anode-side space 23b is returned through the plating solution discharge pipe 110 to the not-shown plating solution supply tank. A plating solution supply mechanism is thus constructed. It is possible to provide a plurality of plating solution supply pipes 108 and a plurality of plating solution discharge pipes 110.

A ring-shaped sealing portion 112 bringing in contact with a peripheral portion of a substrate W to seal the peripheral portion is provided in the substrate W-side end surface of the peripheral wall 100 of the plating tank 20. A plurality of contacts 114 bringing in contact with a peripheral portion of the substrate W to feed an electric current to the substrate W are mounted to the peripheral wall 100 at positions surrounding the outer side (the side not to be in contact with the plating solution) of the sealing portion 112. While keeping the peripheral portion of the substrate W, held by the substrate holder 22, in contact with the contacts 114, the contacts 114 and the anode 104 are connected to a power source 116 to supply an electric current between the substrate W and the anode 104, whereby the electric current is fed from the peripheral portion of the substrate W to the entire surface and plating progresses. In a conducting wire 118, connecting the power source 116 and the anode 104, is interposed a switch 120 that makes use of the circuit, connecting the power source 116, the anode 104 and the substrate W, for an open circuit.

The above-described diaphragm 24, which functions to regulate the flow of the plating solution, needs to use a material or a structure which allows ion conduction for passage of electric current between the anode 104 and the substrate W. If the diaphragm 24 has conductive properties, the diaphragm 24 will act as an anode 104 on the substrate W, which may cause disordered current distribution. In addition, there is a fear of dissolution of the diaphragm 24 or the generation of a gas. Therefore, the diaphragm 24 needs to be an insulator. The diaphragm 24 may be made of any material that is an insulator and permits passage therethrough of ions or electric current.

Examples of the material of the diaphragm 24 may include a porous plastic, a porous ceramic, a porous glass, an ion exchange resin, a dense glass, plastic or ceramic insulating plate having though-holes therethrough, etc. Besides such porous materials, it is possible to use an insulating material having through-holes that allows passage of a small amount of plating solution (e.g., a plastic or glass plate having a large number of small holes). The diaphragm 24 should preferably have a sufficient mechanical rigidity or strength in order not to deform by a flow of the plating solution. Especially when a porous plastic is used for the diaphragm 24, it is preferred to select a material having a high rigidity, or to use a support member such as a PVC punching board. A polyolefin resin SUNFINE AQ, available from Asahi Kasei Chemical Corporation, is an exemplary plastic material for the diaphragm 24. It is also possible to use a polyvinyl alcohol resin, a polyvinyl chloride resin, a polyimide resin, a fluorinated resin, etc. The ceramic material may be exemplified by an SiC ceramic, an alumina ceramic or a silica ceramic. The glass material may be exemplified by VYCOL, available from Corning, Inc.

The operation of the electroplating apparatus will now be described. First, a substrate W in a vertical position is attracted and held by the substrate holder 22. The substrate holder 22, holding the substrate W, is then moved to the plating tank 20, where a peripheral portion of the substrate W is brought into contact with the sealing portion 112 and the contacts 114 provided in the plating tank 20.

Thereafter, a plating solution is supplied through the plating solution supply pipe 108 into the anode-side space 23b of the plating tank 20, whereby the anode-side space 23b becomes filled with the plating solution. The plating solution in the anode-side space 23b is discharged through the plating solution discharge pipe 110 and returned to the anode-side space 23b in a circulatory manner. At the same time, the pump 30 is driven to supply a plating solution from, e.g., the inlet pipe 26a into the flow passage space 23a of the plating tank 20 by selectively using, e.g., the first plating solution supply system 40, thereby filling the flow passage space 23a with the plating solution. The plating solution in the flow passage space 23a is discharged through the outlet pipe 28a and returned to the flow passage space 23a in a circulatory manner while creating a flow of the plating solution flowing in one direction, i.e., in the direction of arrow $F_1$, in the flow passage space 23a.

When using the hot entry method, a voltage is applied between the anode 104 and the substrate W, which serves as a cathode, before starting the supply of the plating solution. As the plating solution is supplied, a plating current comes to flow between the substrate W, to which electricity is fed from each contact 114, and the anode 104 whereby electroplating progresses on the surface of the substrate W. When using the cold entry method, on the other hand, a voltage is applied between the anode 104 and the substrate W, which serves as a cathode, when a predetermined time (wait time) has elapsed after starting the supply of the plating solution. Electroplating of the surface of the substrate W starts simultaneously with the application of the voltage between the anode 104 and the substrate W, which serves as a cathode.

Next, after a predetermined time has elapsed, the first plating solution supply system 40 is changed to the second plating solution supply system 42 in order to switch the flow direction of the plating solution so that the plating solution flows in the flow passage space 23a in the direction of arrow $F_2$ perpendicular to the direction of arrow $F_1$, and electroplating of the surface of the substrate is continued. Electroplating is terminated after repeating the switching of the flow direction of the plating solution in the flow passage space 23a a predetermined times, for example, twice.

Figure 7:
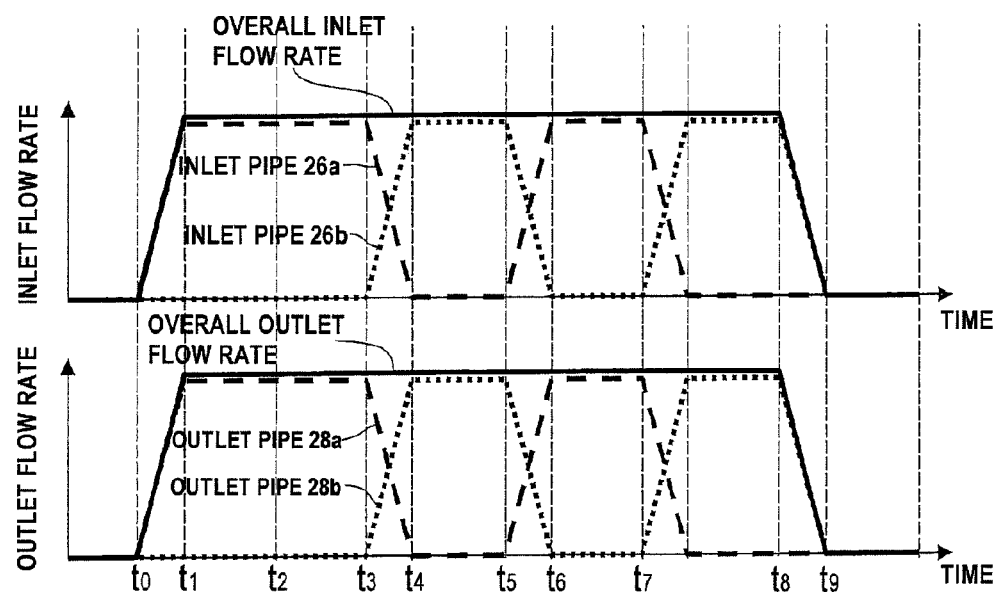
FIG. 7 is a diagram showing the relationship of the inlet flow rate with time and the relationship of the outlet flow rate with time in the plating tank of the electroplating apparatus (substrate processing apparatus) shown in FIGS. 5 and 6.

The flow rate of the plating solution, flowing in each of the inlet pipes 26a, 26b and each of the outlet pipes 28a, 28b during electroplating, will now be described with reference to FIG. 7. The inlet pipes 26a, 26b and the outlet pipes 28a, 28b are initially closed so that the plating solution does not flow therethrough.

First, selectively using the first plating solution supply system 40, the pump 30 is driven to start supply of the plating solution into the flow passage space 23a through the inlet pipe 26a and discharge of the plating solution from the flow passage space 23a through the outlet pipe 28a. The flow control devices 44a, 46a, provided in the inlet pipe 26a and the outlet pipe 28a, are controlled by signals from the control section 48 so that the flow rate of the plating solution flowing in the inlet pipe 26a and the outlet pipe 28a, constituting the first plating solution supply system 40, gradually increases and becomes constant (time: $t_0$-$t_1$).

Stable electroplating starts when the plating solution has come to flow stably in one direction (direction of arrow $F_1$) along the surface of the substrate W in the flow passage space 23a (time: $t_2$).

After a predetermined time has elapsed, the flow control devices 44a, 46a, provided in the inlet pipe 26a and the outlet pipe 28a, are controlled by signals from the control section 48 so that the flow rate of the plating solution flowing in the inlet pipe 26a and the outlet pipe 28a, constituting the first plating solution supply system 40, gradually decreases and becomes zero. At the same time, the flow control devices 44b, 46b, provided in the inlet pipe 26b and the outlet pipe 28b, are controlled by signals from the control section 48 so that the flow rate of the plating solution flowing in the inlet pipe 26b and the outlet pipe 28b, constituting the second plating solution supply system 42, gradually increases and becomes constant (time: $t_3$-$t_4$). The above operation switches the flow direction of the plating solution so that the plating solution flows in the flow passage space 23a in the direction of arrow $F_2$ perpendicular to the direction of arrow $F_1$. The time $t_3$-$t_4$ taken for the switching of the flow direction is generally about 1 to 10 seconds, for example, 2 seconds. The same holds true for the below-described embodiments.

The plating solution is allowed to flow in the direction of arrow $F_2$ in the flow passage space 23a for a predetermined time (time: $t_4$-$t_5$). The time $t_4$-$t_5$ for allowing the plating solution to flow in one direction is generally about 3 to 60 seconds, for example, 30 seconds. The same holds true for the below-described embodiments.

In this embodiment, the flow control devices 44a, 44b, 46a, 46b are controlled so that the overall flow rate of the plating solution supplied into the flow passage space 23a through the inlet pipes 26a, 26b, and the overall flow rate of the plating solution discharged from the flow passage space 23a through the outlet pipes 28a, 28b are kept constant during electroplating.

Next, the flow control devices 44a, 46a, provided in the inlet pipe 26a and the outlet pipe 28a, are controlled by signals from the control section 48 so that the flow rate of the plating solution flowing in the inlet pipe 26a and the outlet pipe 28a, constituting the first plating solution supply system 40, gradually increase and becomes constant. At the same time, the flow control devices 44b, 46b, provided in the inlet pipe 26b and the outlet pipe 28b, are controlled by signals from the control section 48 so that the flow rate of the plating solution flowing in the inlet pipe 26b and the outlet pipe 28b, constituting the second plating solution supply system 42, gradually decreases and becomes zero (time: $t_5$-$t_6$). The above operation switches the flow direction of the plating solution so that the plating solution flows in the direction of arrow $F_1$ in the flow passage space 23a. The plating solution is allowed to flow in the one direction in the flow passage space 23a for a predetermined time (time: $t_6$-$t_7$). The switching of the flow direction, from the direction of arrow $F_1$ to the direction of arrow $F_2$, of the plating solution flowing along the surface of the substrate W in the flow passage space 23a is repeated a predetermined times.

When terminating the electroplating (time: $t_8$), electroplating is stopped and, at the same time, in this embodiment, the flow control devices 44b, 46b, provided in the inlet pipe 26b and the outlet pipe 28b, are controlled by signals from the control section 48 so that the flow rate of the plating solution flowing in the inlet pipe 26b and the outlet pipe 28b, constituting the second plating solution supply system 42, gradually decreases and becomes zero. The supply of the plating solution into the flow passage space 23a and the discharge of the plating solution from the flow passage space 23a are thus stopped (time: $t_9$).

Though in this embodiment the switching between the two flow directions of the plating direction in the flow passage space 23a is repeated twice, the switching repetition number may be set arbitrarily. The time taken for the switching of the flow direction of the plating solution and the time during which the plating solution flows in one direction along the surface of the substrate W in the flow passage space 23a may also be set arbitrarily.

According to this embodiment, when switching the flow direction of the plating solution flowing along the surface of the substrate W in the flow passage space 23a, the flow rate of the plating solution, flowing in each of the inlet pipes 26a, 26b and each of the outlet pipes 28a, 28b, is controlled by the flow control devices 44a, 44b, 46a, 46b so that the flow rate changes with time. This makes it possible to switch the flow direction of the plating solution in the flow passage space 23a without instantaneously increasing or decreasing the flow rate (flow velocity) of the plating solution. In particular, the flow control devices 44a, 44b, 46a, 46b are controlled so that the plating solution is continuously supplied at a constant flow rate into the flow passage space 23a even during switching of the flow direction of the plating solution when both of the inlet pipes 26a, 26b and both of the outlet pipes 28a, 28b are used. Thus, the flow direction of the plating solution in the flow passage space 23a can be switched while supplying the plating solution at a constant flow rate into the flow passage space 23a.

Figure 8:
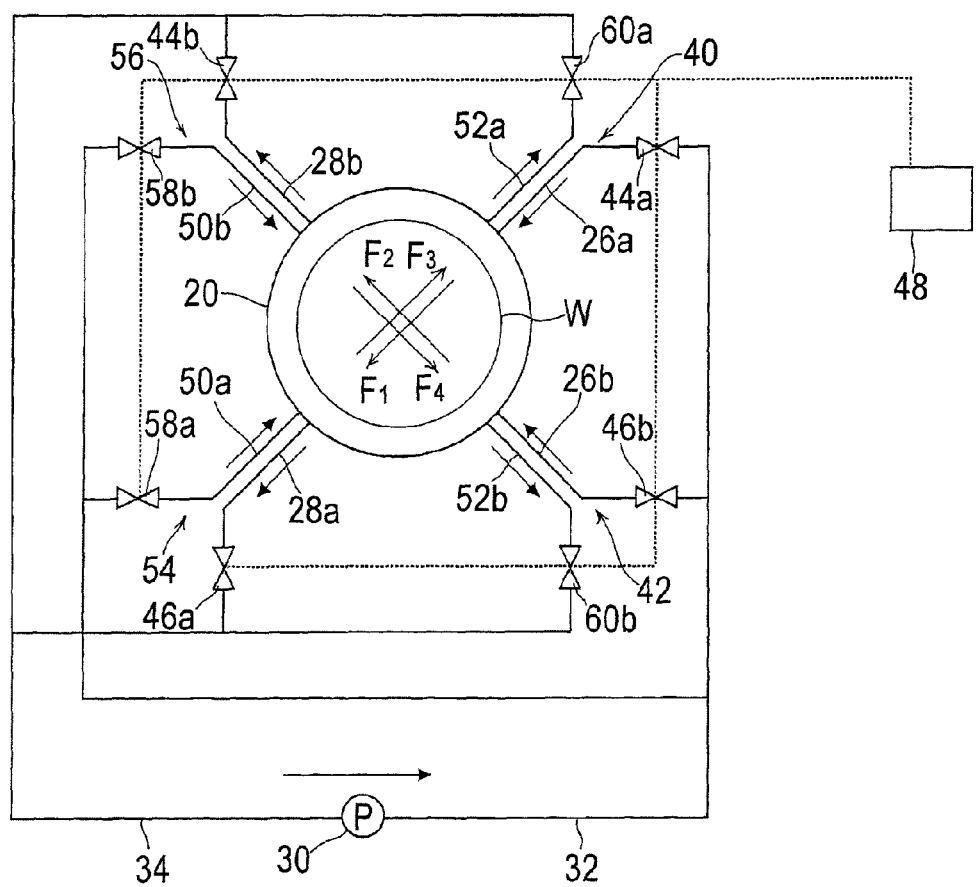
FIG. 8 is a schematic plan view showing the construction of a substrate processing apparatus according to another embodiment of the present invention, which is applied to an electroplating apparatus.

FIG. 8 is a schematic plan view showing the construction of a substrate processing apparatus according to another embodiment of the present invention, which is applied to an electroplating apparatus. The electroplating apparatus (substrate processing apparatus) of this embodiment differs from the electroplating apparatus shown in FIGS. 5 and 6, as follows:

The electroplating apparatus of this embodiment has inlet pipes 50a, 50b located in the vicinity of the outlet pipes 28a, 28b, and outlet pipes 52a, 52b located in the vicinity of the inlet pipes 26a, 26b. The inlet pipes 50a, 50b are connected to the discharge pipe 32 extending from the discharge port of the pump 30, while the outlet pipes 52a, 52b are connected to the suction pipe 34 extending from the suction port of the pump 30.

The inlet pipe 50a and the outlet pipe 52a constitute a third plating solution supply system 54 which creates in the flow passage space 23a a flow of the plating solution, flowing in the direction of arrow $F_3$ opposite to the arrow $F_1$ direction of the flow of the plating solution created by the above-described first plating solution supply system 40. The inlet pipe 50b and the outlet pipe 52b constitute a fourth plating solution supply system 56 which creates in the flow passage space 23a a flow of the plating solution, flowing in the direction of arrow $F_4$ opposite to the arrow $F_2$ direction of the flow of the plating solution created by the above-described second plating solution supply system 42. One of the first plating solution supply system 40, the second plating solution supply system 42, the third plating solution supply system 54 and the fourth plating solution supply system 56 is used selectively. Thus, the flow direction of the plating solution, flowing along a surface of a substrate W in the flow passage space 23a of the plating tank 20, can be switched among the four directions of the arrows $F_1$, $F_2$, $F_3$ and $F_4$.

As in the above-described embodiment, the inlet pipes 50a, 50b are provided with flow control devices 58a, 58b, respectively, which are each comprised of, e.g., a mass flow controller. The outlet pipes 52a, 52b are also provided with flow control devices 60a, 60b, respectively, which are each comprised of, e.g., a mass flow controller. The flow control devices (mass flow controllers) 58a, 58b, 60a, 60b are also controlled by signals from the control section 48.

In operation of the electroplating apparatus of this embodiment, as in the above-described embodiment, the peripheral portion of a substrate W, attracted and held by the substrate holder 22, is brought into contact with the sealing portion 112 and the contacts 114 provided in the plating tank 20, and subsequently the supply of the plating solution into the anode-side space 23b is started. At the same time, the pump 30 is driven to supply a plating solution from the inlet pipe 26a into the flow passage space 23a of the plating tank 20 by selectively using, e.g., the first plating solution supply system 40, thereby filling the flow passage space 23a with the plating solution. The plating solution in the flow passage space 23a is discharged through the outlet pipe 28a and returned to the flow passage space 23a in a circulatory manner while creating a flow of the plating solution flowing in one direction, i.e., in the direction of arrow $F_1$, in the flow passage space 23a. Electroplating of the surface of the substrate is carried out using the above-described hot entry method or cold entry method.

Next, after a predetermined time has elapsed, the first plating solution supply system 40 is changed to the second plating solution supply system 42 in order to switch the flow direction of the plating solution so that the plating solution flows in the flow passage space 23a in the direction of arrow $F_2$ perpendicular to the direction of arrow $F_1$, and electroplating of the surface of the substrate is continued. After a predetermined time has elapsed, the second plating solution supply system 42 is changed to the third plating solution supply system 54 in order to switch the flow direction of the plating solution so that the plating solution flows in the flow passage space 23a in the direction of arrow $F_3$ opposite to the direction of arrow $F_1$, and electroplating of the surface of the substrate is continued. Further, after a predetermined time has elapsed, the third plating solution supply system 54 is changed to the fourth plating solution supply system 56 in order to switch the flow direction of the plating solution so that the plating solution flows in the flow passage space 23a in the direction of arrow $F_4$ opposite to the direction of arrow $F_2$, and electroplating of the surface of the substrate is continued. The above cycle of switchings of the flow direction of the plating solution may be performed once or repeated a plurality of times.

Figure 9:
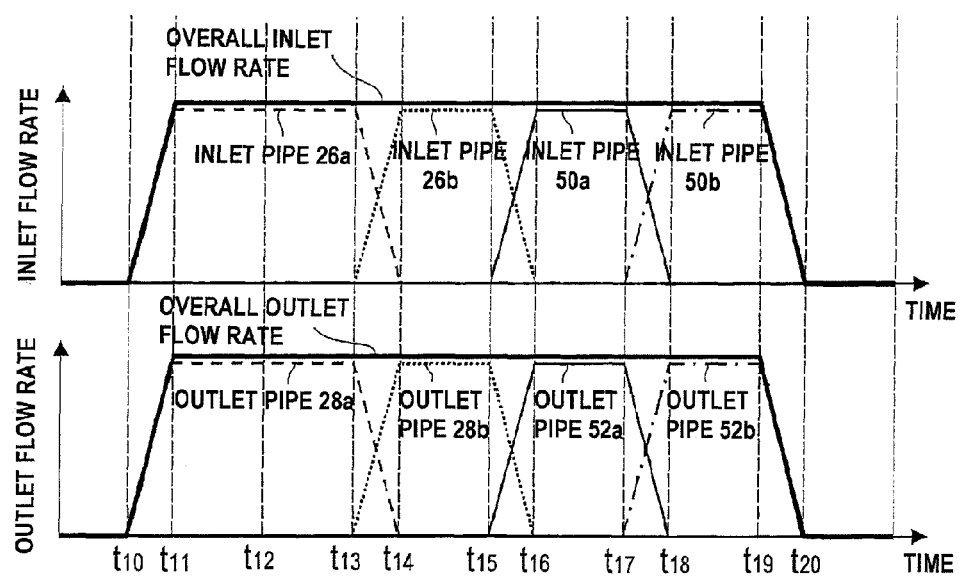
FIG. 9 is a diagram showing the relationship of the inlet flow rate with time and the relationship of the outlet flow rate with time in a plating tank of the electroplating apparatus (substrate processing apparatus) shown in FIG. 8.

The flow rate of the plating solution, flowing in each of the inlet pipes 26a, 26b, 50a, 50b and each of the outlet pipes 28a, 28b, 52a, 52b during electroplating, will now be described with reference to FIG. 9. The inlet pipes 26a, 26b, 50a, 50b and the outlet pipes 28a, 28b, 50a, 50b are initially closed so that the plating solution does not flow therethrough.

First, selectively using, e.g., the first plating solution supply system 40, the pump 30 is driven to start supply of the plating solution into the flow passage space 23a through the inlet pipe 26a and discharge of the plating solution from the flow passage space 23a through the outlet pipe 28a. The flow control devices 44a, 46a, provided in the inlet pipe 26a and the outlet pipe 28a, are controlled by signals from the control section 48 so that the flow rate of the plating solution flowing in the inlet pipe 26a and the outlet pipe 28a, constituting the first plating solution supply system 40, gradually increases and becomes constant (time: $t_{10}$-$t_{11}$).

Stable electroplating starts when the plating solution has come to flow stably in one direction (direction of arrow $F_1$) along the surface of the substrate W in the flow passage space 23a (time: $t_{12}$).

After a predetermined time has elapsed, the flow control devices 44a, 46a, provided in the inlet pipe 26a and the outlet pipe 28a, are controlled by signals from the control section 48 so that the flow rate of the plating solution flowing in the inlet pipe 26a and the outlet pipe 28a, constituting the first plating solution supply system 40, gradually decreases and becomes zero. At the same time, the flow control devices 44b, 46b, provided in the inlet pipe 26b and the outlet pipe 28b, are controlled by signals from the control section 48 so that the flow rate of the plating solution flowing in the inlet pipe 26b and the outlet pipe 28b, constituting the second plating solution supply system 42, gradually increases and becomes constant (time: $t_{13}$-$t_{14}$).

The above operation switches the flow direction of the plating solution so that the plating solution flows in the flow passage space 23a in the direction of arrow $F_2$ perpendicular to the direction of arrow $F_1$. The plating solution is allowed to flow in the one direction in the flow passage space 23a for a predetermined time (time: $t_{14}$-$t_{15}$).

Next, the flow control devices 58a, 60a, provided in the inlet pipe 50a and the outlet pipe 52a, are controlled by signals from the control section 48 so that the flow rate of the plating solution flowing in the inlet pipe 50a and the outlet pipe 52a, constituting the third plating solution supply system 54, gradually increase and becomes constant. At the same time, the flow control devices 44b, 46b, provided in the inlet pipe 26b and the outlet pipe 28b, are controlled by signals from the control section 48 so that the flow rate of the plating solution flowing in the inlet pipe 26b and the outlet pipe 28b, constituting the second plating solution supply system 42, gradually decreases and becomes zero (time: $t_{15}$-$t_{16}$).

The above operation switches the flow direction of the plating solution so that the plating solution flows in the flow passage space 23a in the direction of arrow $F_3$ opposite to the direction of arrow $F_1$. The plating solution is allowed to flow in the one direction in the flow passage space 23a for a predetermined time (time: $t_{16}$-$t_{17}$).

Next, the flow control devices 58b, 60b, provided in the inlet pipe 50b and the outlet pipe 52b, are controlled by signals from the control section 48 so that the flow rate of the plating solution flowing in the inlet pipe 50b and the outlet pipe 52b, constituting the fourth plating solution supply system 56, gradually increase and becomes constant. At the same time, the flow control devices 58a, 60a, provided in the inlet pipe 50a and the outlet pipe 52a, are controlled by signals from the control section 48 so that the flow rate of the plating solution flowing in the inlet pipe 50a and the outlet pipe 52a, constituting the third plating solution supply system 54, gradually decreases and becomes zero (time: $t_{17}$-$t_{18}$).

The above operation switches the flow direction of the plating solution so that the plating solution flows in the flow passage space 23a in the direction of arrow $F_4$ opposite to the direction of arrow $F_2$. The plating solution is allowed to flow in the one direction in the flow passage space 23a for a predetermined time (time: $t_{18}$-$t_{19}$).

When terminating the electroplating (time: $t_{19}$), electroplating is stopped and, at the same time, the flow control devices 58b, 60b, provided in the inlet pipe 50b and the outlet pipe 52b, are controlled by signals from the control section 48 so that the flow rate of the plating solution flowing in the inlet pipe 50b and the outlet pipe 52b, constituting the fourth plating solution supply system 56, gradually decreases and becomes zero. The supply of the plating solution into the flow passage space 23a and the discharge of the plating solution from the flow passage space 23a are thus stopped (time: $t_{20}$).

Though in this embodiment the cycle of switchings among the four flow directions of the plating direction in the flow passage space 23a is performed only once, the switching cycle repetition number may be set arbitrarily. As in the above-described embodiment, the time taken for the switching of the flow direction of the plating solution and the time during which the plating solution flows in one direction along the surface of the substrate W in the flow passage space 23a may also be set arbitrarily.

According to this embodiment, when switching the flow direction of the plating solution flowing along the surface of the substrate W in the flow passage space 23a, the flow rate of the plating solution, flowing in each of the inlet pipes 26a, 26b, 50a, 50b and each of the outlet pipes 28a, 28b, 52a, 52b is controlled by the flow control devices 44a, 44b, 46a, 46b, 58a, 58b, 60a, 60b so that the flow rate changes with time. This makes it possible to switch the flow direction of the plating solution among the four directions in the flow passage space 23a without instantaneously increasing or decreasing the flow rate (flow velocity) of the plating solution. In particular, the flow control devices 44a, 44b, 46a, 46b, 58a, 58b, 60a, 60b are controlled so that the plating solution is continuously supplied at a constant flow rate into the flow passage space 23a even during switching of the flow direction of the plating solution when two of the inlet pipes 26a, 26b, 50a, 50b and two of the outlet pipes 28a, 28b, 52a, 52b are used. Thus, the flow direction of the plating solution in the flow passage space 23a can be switched while supplying the plating solution at a constant flow rate into the flow passage space 23a.

Figure 10:
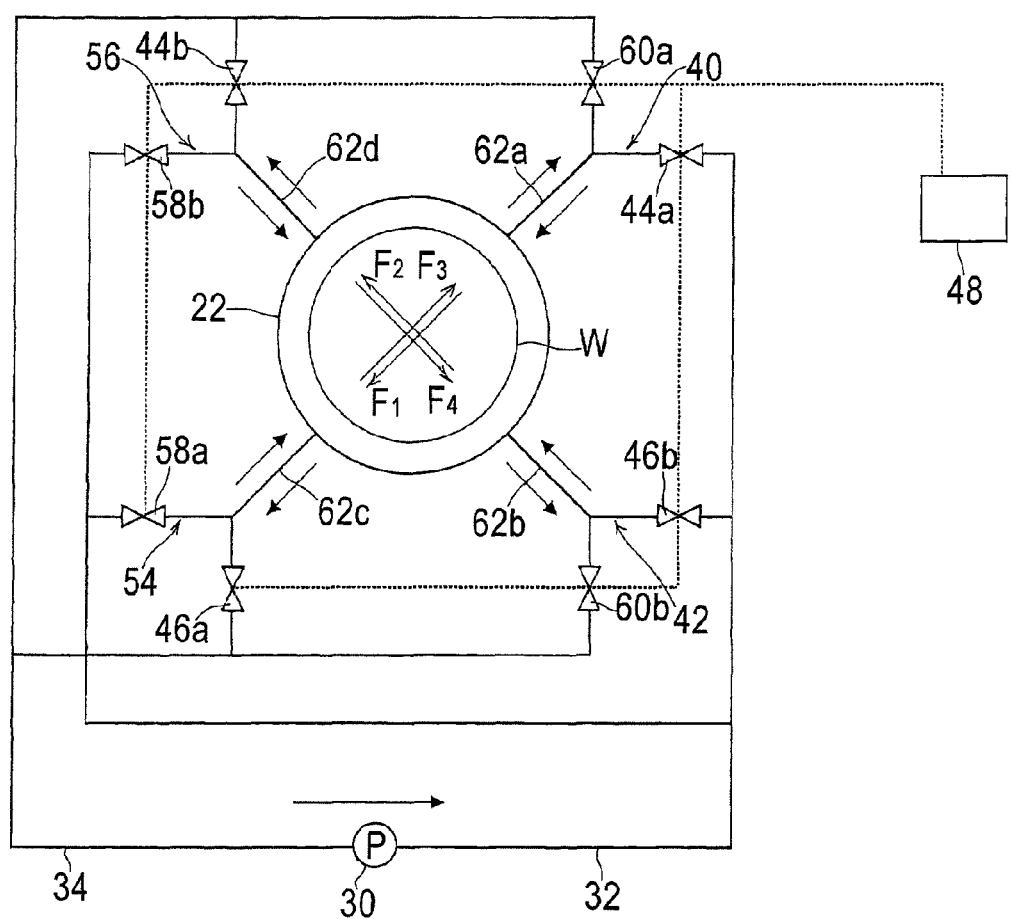
FIG. 10 is a schematic plan view showing the construction of a substrate processing apparatus according to yet another embodiment of the present invention, which is applied to an electroplating apparatus.

FIG. 10 is a schematic plan view showing the construction of a substrate processing apparatus according to yet another embodiment of the present invention, which is applied to an electroplating apparatus. This embodiment differs from the embodiment shown in FIG. 8 in that those inlet and outlet pipes, which are located close to each other in the preceding embodiment, are integrated into a common pipe so as to simplify the construction. Thus, the inlet pipe 26a and the outlet pipe 52a are integrated into a common pipe 62a, the inlet pipe 26b and the outlet pipe 52b are integrated into a common pipe 62b, the inlet pipe 50a and the outlet pipe 28a are integrated into a common pipe 62c, and the inlet pipe 50b and the outlet pipe 28b are integrated into a common pipe 62d.

Figure 11:
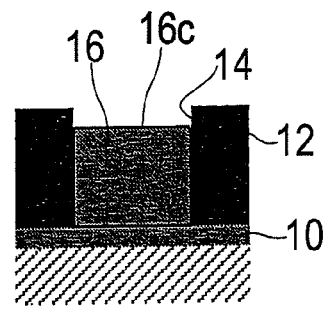
FIG. 11 is a cross-sectional diagram illustrating the formation of a bump by the electroplating apparatus (substrate processing apparatus) shown in FIG. 8.

It has been confirmed experimentally that when a surface of a substrate (wafer having a diameter of 300 mm), having an opening 14 formed in a resist 12 on a surface of a seed layer 10, as shown in FIG. 11, is subjected to electroplating by the electroplating apparatus shown in FIG. 8, carried out in such a manner that a plating solution is continuously supplied into the flow passage space 23a at a constant flow rate of 10 L/min even during switching of the flow direction of the plating solution flowing along the surface of the substrate, a bump (plated film) 16, whose surface 16c is flat and free of abnormal deposition, can be formed. The plating time is, for example, several tens of minutes to several hours.

Figure 12:
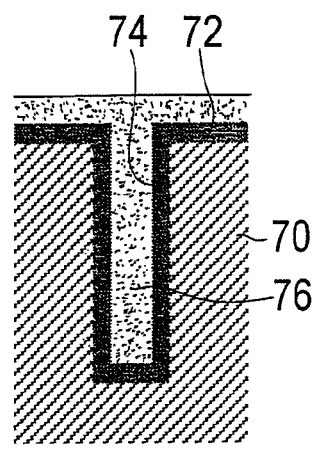
FIG. 12 is a cross-sectional diagram illustrating via-filling plating by the electroplating apparatus (substrate processing apparatus) shown in FIG. 8.

It has also been confirmed experimentally that when a surface of a substrate (wafer having a diameter of 300 mm), having a via 74 formed in an insulator 70 and covered with a seed layer 72, as shown in FIG. 12, is subjected to electroplating carried out in the same manner by using the same electroplating apparatus, an interconnect metal (plated film) 76 can be filled into the via 74 without the formation of voids in the embedded metal. The plating time is, for example, about one to two minutes.

The flow rate of the plating solution supplied into the flow passage space 23a during electroplating, including the time period for switching of the flow direction of the plating solution, is generally 0 to 20 L/min, preferably 4 to 12 L/min, and more preferably 8 to 12 L/min.

Electroplating using the above-described hot entry method or the above-described cold entry method will now be described in detail.

Figure 13A:
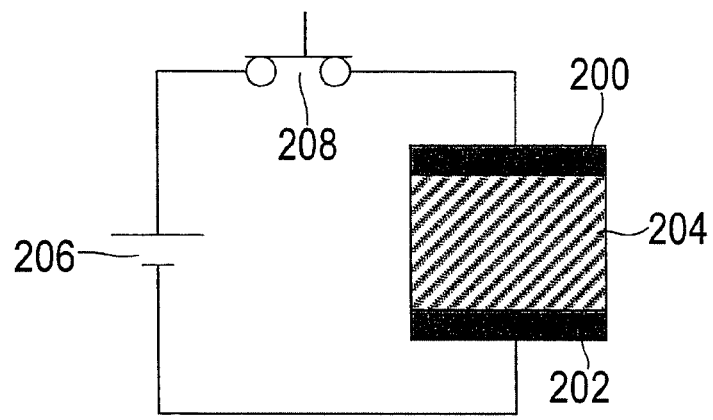
FIG. 13A is a diagram showing a closed circuit.

FIG. 13A shows a closed circuit in which a switch 208 is provided in a circuit for applying a voltage from a power source 206 to between an anode 200 and a cathode (substrate) 202 via a plating solution (electrolytic solution) 204, and the switch 208 is closed. Even when the power source 206 is "off" in the closed circuit, a natural electric current flows in the circuit due to an electrode potential when the plating solution (electrolytic solution) 204 is present between the anode 200 and the cathode (substrate) 202, whereby, e.g., a seed layer or a plated film on the substrate can be etched (etching will not occur when the plating solution 204 is absent between the anode 200 and the cathode 202).

Figure 13B:
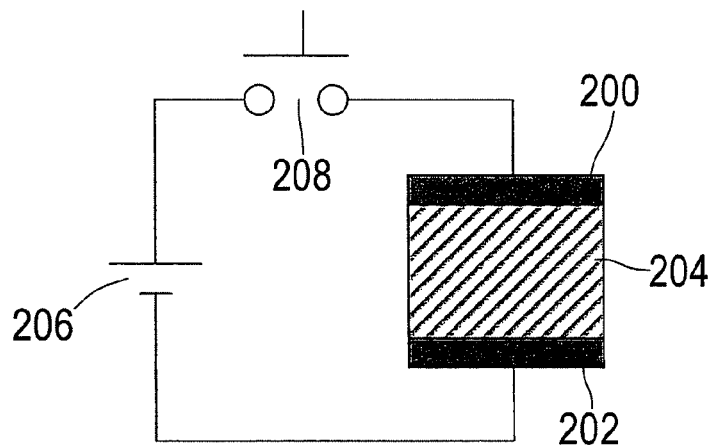
FIG. 13B is a diagram showing an open circuit.

On the other hand, FIG. 13B shows an open circuit in which a switch 208 is provided in a circuit for applying a voltage from a power source 206 to between an anode 200 and a cathode (substrate) 202 via a plating solution (electrolytic solution) 204, and the switch 208 is open. In the case of such an open circuit, a natural electric current does not flow even when the plating solution 204 is present between the anode 200 and the cathode 202, and therefore etching will not occur due to a natural electric current flow.

The hot entry method is a method in which a voltage is applied between an anode and a cathode (substrate) before a plating solution is supplied between them, and is used mainly in fine interconnect plating to fill a metal (interconnect material) into fine interconnect trenches or vias provided in a surface of a substrate such as a semiconductor wafer. The cold entry method is not used in fine interconnect plating because (a) chemical etching occurs even with the use of an open circuit, and therefore a very thin copper seed layer (having a thickness of less than 5 nm on the side wall of a via) can dissolve by etching, (b) adsorption of an additive onto the internal surface of a via becomes uniform with time over the entire surface when the cold entry method is used, which prevents bottom-up growth of a plated film due to a difference in the adsorption rate of the additive between the bottom and the top of the via, etc.

Electroplating using the hot entry method is usually carried out under constant voltage control. In particular, a voltage V, corresponding to a target plating current I, is applied between an anode and a cathode (substrate) prior to plating. The electric current gradually increases as the space between the anode and the cathode (substrate) is gradually filled with a plating solution, and reaches the value I when the plating solution comes to cover the entire surface of the substrate.

The cold entry method is a method in which a voltage is applied between an anode and a cathode (substrate) after the space between the anode and the cathode is filled with a plating solution. As described above, a natural electric current will flow in a closed circuit when the plating solution is present between the anode and the cathode (substrate), which may progress etching due to a natural electric current flow. The circuit of the plating system is therefore kept open until the start of application of a voltage. The cold entry method is used mainly in bump plating, re-wiring plating, TSV (through silicon via) plating, or the like. A trench width is larger and a seed layer is thicker in such plating than in fine interconnect plating, and the mechanism of the bottom-up growth of a plated film in such plating differs from that in fine interconnect plating. The cold entry method is more suitable for such plating than the hot entry method.

Figure 14:
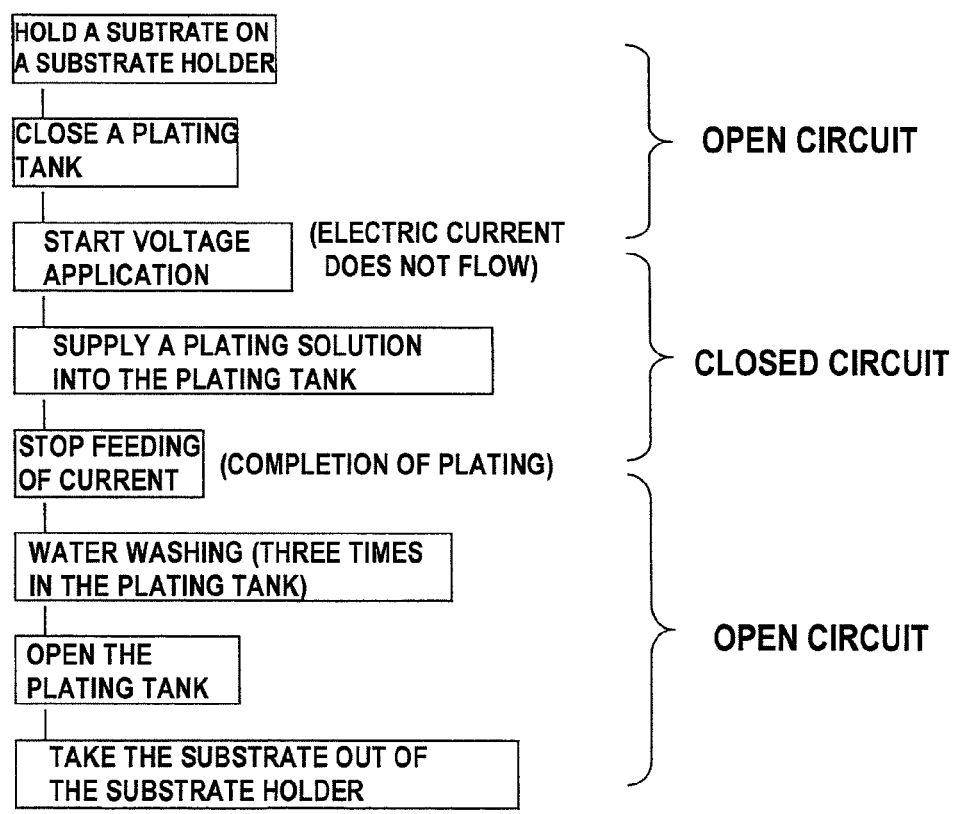
FIG. 14 is a block diagram illustrating the operation of the electroplating apparatus shown in FIGS. 5 and 6 in carrying out electroplating using the hot entry method.

The operation of the electroplating apparatus shown in FIGS. 5 and 6 in carrying out electroplating using the hot entry method will now be described with reference to FIG. 14.

Before the start of plating, the circuit connecting the power source 116, the anode 104 and a substrate W is kept open by opening the switch 120. After a substrate W is held by the substrate holder 22, the substrate holder 22 is moved to the plating tank 20 and the opening of the plating tank 20 is closed with the substrate W held by the substrate holder 22 (plating tank is closed).

Next, the power source 116 is turned on and, simultaneously with or with a small time difference from the turning on of the power source 116, the switch 120 is closed by a sequencer so as to close the circuit connecting the power source 116, the anode 104 and the substrate W. Thereafter, a plating solution is supplied into the flow passage space 23a and the anode-side space 23b of the plating tank 20, and electroplating of the surface of the substrate W is carried out as in the above-described manner.

Upon the completion of plating, the plating solution is discharged from the plating tank 20, the power source 116 is turned off and, simultaneously with or with a small time difference from the turning off of the power source 116, the switch 120 is opened by the sequencer so as to open the circuit connecting the power source 116, the anode 104 and the substrate W. By keeping the circuit open after turning the power source 116 off, etching of a plated film can be avoided even when there is a residual plating solution in the plating tank 20.

Next, the interior of the plating tank 20 is washed with water, e.g., three times. The substrate holder 22 is then moved in a direction away from the plating tank 20, thereby detaching the substrate W, which has been closing the opening of the plating tank 20, from the plating tank 20 (plating tank is opened). Thereafter, the substrate W is taken out of the substrate holder 22.

Figure 15:
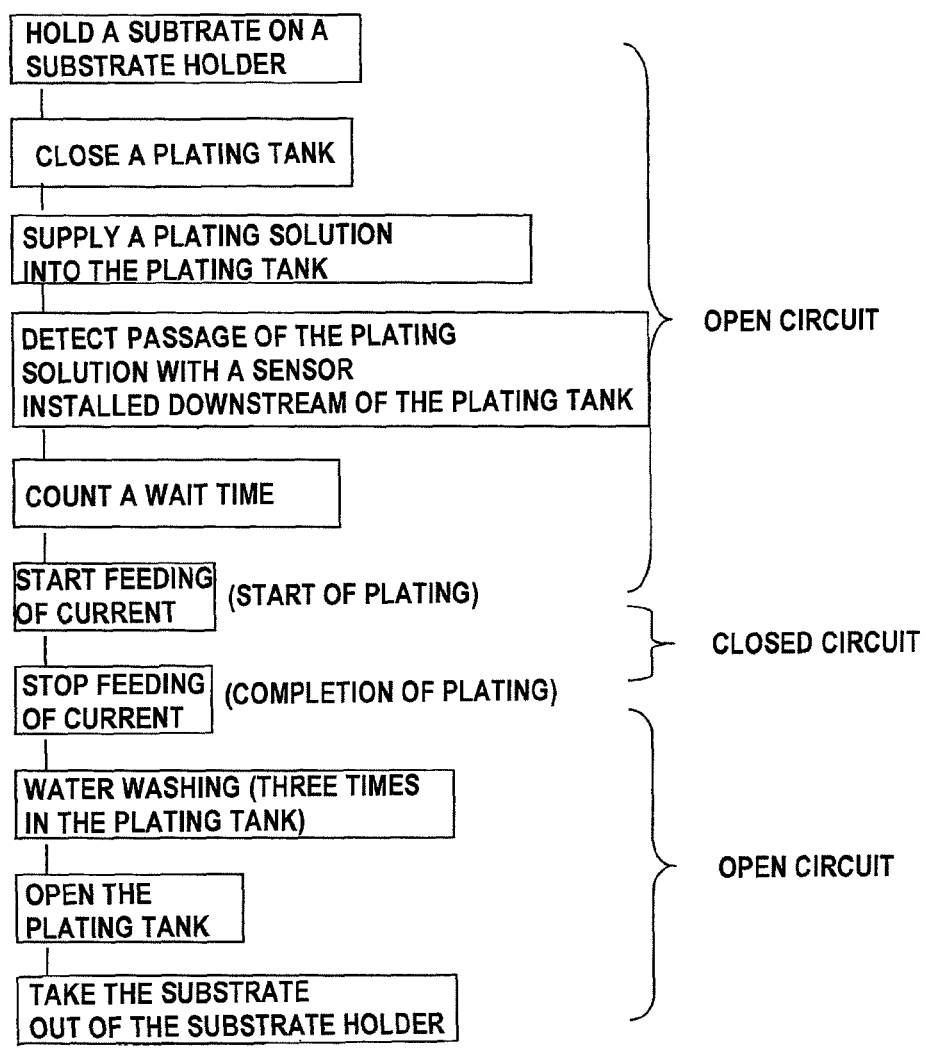
FIG. 15 is a block diagram illustrating the operation of the electroplating apparatus shown in FIGS. 5 and 6 in carrying out electroplating using the cold entry method.

The operation of the electroplating apparatus shown in FIGS. 5 and 6 in carrying out electroplating using the cold entry method will now be described with reference to FIG. 15.

Before the start of plating, the circuit connecting the power source 116, the anode 104 and a substrate W is kept open by opening the switch 120. After a substrate W is held by the substrate holder 22, the substrate holder 22 is moved to the plating tank 20 and the opening of the plating tank 20 is closed with the substrate W held by the substrate holder 22 (plating tank is closed).

Next, a plating solution is supplied into the flow passage space 23a and the anode-side space 23b of the plating tank 20 as in the above-described manner. A sensor is installed downstream of the plating tank 20 to detect passage of the plating solution. An optical sensor, which makes use of a difference in refractive index or transmittance, is preferably used as the sensor for detecting passage of the plating solution.

A wait time is counted after detection of passage of the plating solution by the sensor installed downstream of the plating tank 20. The wait time refers to the time it takes for copper ions to diffuse to the bottom of a via, trench or the like. A longer wait time is set for a deeper via. In a specific example, the wait time is 30 seconds for a via having a depth of 50 μm, and 1 minute for a via having a depth of 120 μm. The wait time is generally 0 to 5 minutes, preferably 20 seconds to 3 minutes, more preferably 30 seconds to 1 minute.

After the wait time has elapsed, the power source 116 is turned on and, simultaneously with or with a small time difference from the turning on of the power source 116, the switch 120 is closed by a sequencer so as to close the circuit connecting the power source 116, the anode 104 and the substrate W. An electric current therefore begins to flow between the anode 104 and the substrate (cathode) W, whereby electroplating of the surface of the substrate W starts.

Upon the completion of plating, the plating solution is discharged from the plating tank 20, the power source 116 is turned off and, simultaneously with or with a small time difference from the turning off of the power source 116, the switch 120 is opened by the sequencer so as to open the circuit connecting the power source 116, the anode 104 and the substrate W.

Next, the interior of the plating tank 20 is washed with water, e.g., three times. The substrate holder 22 is then moved in a direction away from the plating tank 20, thereby detaching the substrate W, which has been closing the opening of the plating tank 20, from the plating tank 20 (plating tank is opened). Thereafter, the substrate W is taken out of the substrate holder 22.

While the present invention has been described with reference to preferred embodiments, it is understood that the present invention is not limited to the embodiments described above, but is capable of various changes and modifications within the scope of the inventive concept as expressed herein.

What is claimed is:

1. A substrate processing apparatus comprising:
   a control section;
   a processing tank configured to hold a processing liquid;
   a substrate holder configured to hold a substrate and bring the substrate into contact with the processing liquid in the processing tank;
   a plurality of inlet pipes connected to the processing tank, each of the plurality of inlet pipes comprising a mass flow controller and being configured to be switched therebetween; and a plurality of outlet pipes connected to the processing tank, each of the plurality of outlet pipes comprising a mass flow controller and being configured to be switched therebetween, and being configured to create a flow of the processing liquid along a surface of the substrate in the processing tank in a second direction different from a first direction of the flow of the processing liquid before a switching between the plurality of inlet pipes, and the control section being configured to control each of the mass flow controllers to change a flow rate of the processing liquid supplied by one of the plurality of inlet pipes to the surface of the substrate with time over 1 second to 10 seconds, upon the switching between the plurality of inlet pipes or a switching between the plurality of outlet pipes; and a pump configured to supply the processing liquid into the processing tank in a circulatory manner through the plurality of inlet pipes and the plurality outlet pipes.

2. The substrate processing apparatus according to claim 1, wherein the control section is further configured to control each of the mass flow controllers to maintain an overall flow rate of the processing liquid supplied into the processing tank at a constant flow rate even upon the switching between the plurality of inlet pipes and the switching between the plurality of outlet pipes.

* * * * *